United States Patent [19]

Eitan et al.

[11] Patent Number: 5,682,353
[45] Date of Patent: Oct. 28, 1997

[54] SELF ADJUSTING SENSE AMPLIFIER CLOCK DELAY CIRCUIT

[75] Inventors: Boaz Eitan, Ra'anana, Israel; Larry Willis Petersen, Pocatello, Id.; Yaron Slezak, Kiriat Motzkin, Israel

[73] Assignees: Waferscale Integration Inc., Fremont, Calif.; American Microsystems, Inc., Pocatello, Id.

[21] Appl. No.: 665,151

[22] Filed: Jun. 13, 1996

[51] Int. Cl.[6] .................................................. G11C 8/00
[52] U.S. Cl. .................. 365/233; 365/185.21; 365/194; 365/233.5
[58] Field of Search ........................ 365/185.21, 194, 365/233, 243, 233.5

[56] References Cited

U.S. PATENT DOCUMENTS

| | | | |
|---|---|---|---|
| 4,761,765 | 8/1988 | Hashimoto | 365/185 |
| 5,245,584 | 9/1993 | Zampaglione et al. | 365/233 |
| 5,424,985 | 6/1995 | McClure et al. | 365/194 |

Primary Examiner—David C. Nelms
Assistant Examiner—F. Niranjan
Attorney, Agent, or Firm—Skjerven, Morrill, MacPherson, Franklin & Friel

[57] ABSTRACT

A clock delay circuit for generating a delay for a sense amplifier release signal in an integrated circuit semiconductor memory device is disclosed. Rather than utilize traditional programmable capacitors that must be trimmed on a die by die basis, the novel clock delay circuit disclosed utilizes a small ROM, EPROM, EEPROM or FLASH array coupled to a bit line emulator to provide a clock delay matched to the larger main array. The size of the small memory array is on the order of 5 to 10 bit lines by 5 to 10 word lines. One cell within the small array is fixed to be continuously selected. The selected cell is coupled to the clock delay node along with the bit line emulator. The bit line emulator models the capacitance of the actual bit line used in the main array. However, the circuit is constructed so that a much larger signal is generated by the delay circuit such that sense amplifiers detect the correct signal. The CMOS based clock delay circuit uses the emulated array to generate a delta or margin that accurately tracks the delays within the main array with variations in temperature, supply voltage and process.

25 Claims, 6 Drawing Sheets

SELF ADJUSTING SENSE AMPLIFIER CLOCK DELAY CIRCUIT

FIELD OF THE INVENTION

The present invention relates generally to semiconductor memory devices and more particularly relates to sense amplifier clock delay circuits.

BACKGROUND OF THE INVENTION

Typically, clocked semiconductor memory designs include a memory array, X and Y decoders, sense amplifiers and output buffers. An address is input to the decoders which function to address a specific set of 8 bits (if the memory device is a byte wide memory) and, after a certain time, the data is available at the input to the sense amps. The output of the sense amps are input to the output buffer which output the data memory byte. The memory is addressed by word lines which are selected by the X-decoder and by bit lines which are addressed by the Y-decoder. The X-decoder functions to generate the word line signal and the Y-decoder functions to generate the bit line signal.

A clock chain circuit functions to precharge or equalize all the bit lines while the X_decoder is selecting the word line. The bit line is available typically before the word line. When the proper word line has been selected and is ready, the bit lines are already precharged and equalized. In a clocked memory design equalization should cease when the word line is ready. This is the appropriate time to start developing a signal in accordance with the stored value of the bit. If the bit is a 1 then the bit line will begin to be discharged and if the bit is a 0 then bit lines voltage will remain as it was. In a clocked design, the sense amplifier is also equalized meaning that its input is held in an intermediate state waiting for a signal to develop. Once signal is available the sense amp input is released and the input signal is amplified and propagates to the output buffer.

A problem with typical clocked memory designs of the type described above, is, from the time the word line is ready, when to release the sense amp and allow the signal to propagate through to the output buffer. In ready only memories (ROM), electrically programmable read only memory (EPROM), electrically erasable programmable read only memory (EEPROM) or flash EEPROM (FLASH), the signal development time for the bit in the array being addressed to be available can only be tracked by a CMOS clock within a factor of 2 or 3. This is due to the fact that the variations in the CMOS process technology do not track relative to the variations in the memory cell array process technology. Typically, it is very difficult for variations in CMOS process technology to track ROM/EPROM cell process technology. The sensitivities of these two types of circuitry do not track with process variations in the same way. The only way to guarantee that enough time has been given for the signal to develop is to give a big enough margin to the clock delay. This solution, however, wastes a lot of time and prevents the production of the fastest possible product.

The clock delay time is critical because the sense amp is held at maximum gain. If the sense amp is released too early (i.e., the correct signal is not yet available) the output of the sense amp may swing the wrong way. This is termed a glitch and the recovery time when the sense amp goes the wrong way is relatively long. Thus, in order to achieve the shortest access times possible, it is desirable to guarantee that the signal input to the sense amp be available and correct before the sense amp is released.

During equalization or precharge the bit lines and the source lines are typically held within a small tolerance of each other. These signals comprise the inputs to the sense amps which themselves are typically differential sense amps rather than single ended sense amps. Differential sense amps have better gain and noise immunity than single ended sense amps. Their higher gain helps minimize the time to develop an output signal. Single ended sense amps are very sensitive to noise and need a higher input signal due to the fact that they use a DC reference to generate their output.

One possible solution to the glitch problem described above is to design for the worst case cell under the worst case conditions and then add a margin of safety. This guarantees an upper limit on the time delay but it also wastes a great deal of speed. Another possible solution is to trim the clock delay circuit for each die on a die by die basis. The clock delay circuit would incorporate programmable options that allow the delay for that particular die to be optimized. The trimming process would begin with the fastest possible option. If the circuit glitches it means the sense amps did not receive enough signal because the sense amplifier swung the wrong way and had to be corrected. The delay is then increased, allowing more and more signal development time, until no glitches occur. This is the fastest possible setting for that particular die. Then one more step of delay is added as a margin of safety and the settings are programmed into the memory device.

A schematic diagram illustrating the prior art clock delay circuit is shown in FIG. 1. A timing diagram of the signals shown in FIG. 1 is illustrated in FIG. 2. The signal that is input to the clock circuit originates from address transition detection circuitry incorporating the word line select delay. This signal functions to provide a trigger for the clock circuit whenever one of the address lines changes state. This is necessary because the memory device functions asynchronously from the perspective of the user. Internally, however, the memory array is accessed synchronously and therefore requires a clock. The signal from the address transition detection circuitry including the word line delay is input to a NAND gate 13. The output of the NAND gate 13 is input to pull-up 14 and an n-channel transistor 12 which function together as an inverter. The pull-up 14 may be a p-channel transistor or any other equivalent pull-up means which can function as a current source. The output of the inverter, labeled as node A, is coupled to one or more inverters 20, 22 to bring the signal to CMOS levels and provide further delay. Coupled to node A are one or more programmable capacitances 16, 18 coupled to ground. Each programmable capacitance has a select line coupled to it. Select line SELECT_0 coupled to the first programmable capacitance 16 and select line SELECT_N coupled to the $(N+1)^{th}$ programmable capacitance 18. Also illustrated in FIG. 1 is memory circuit 29 which comprises an X-decoder 24, Y-decoder 25, memory array 26, sense amplifier 27 and output buffer 28. The output of inverter 22 is coupled to the sense amp release circuit (not shown) within sense amp 27.

Node A is the node that is to be trimmed. When the address transition detection circuitry is first triggered and after the word line select delay, node A is discharged to ground. When the word line is ready the array precharging ceases and the signal development of the memory array 26 begins. The pull-up 14 acts as a leader device. The time to precharge node A is a function of the pull-up, the programmable capacitances and the trip point of the following stage (i.e., the sense amp release circuit). Until the word line is ready, the output of the NAND gate 13 is held high so that transistor 12 clamps node A to ground. When the word line is ready, the output of the NAND gate 13 goes low and the leaker (i.e., pull-up 14) starts to pull node A up. When node A has reached a high enough level, inverters 20, 22 toggle and the sense amp is released. The rise time of node A is determined by the number and value of the programmable capacitances 16, 18. As the capacitance coupled to node A increases, the charging of node A as well as the word line signal take longer and longer to propagate, thus decreasing the speed of the part. The fastest time is with no capacitance coupled to the node. The slowest time is with all programmable capacitances coupled to the node.

The timing relationships of the circuit illustrated in FIG. 1 are shown in FIG. 2. The address transition detection signal falls low when a transition is detected. After the word line select delay, node A and the sense amp delay signal go low. Once the address transition detection signal goes high and after the word line select delay, node A is charged in accordance with the time constant of the pull-up and the programmable capacitances. At this point the word line is ready, array equalization ends and signal development in the main array begins. Once a threshold is reached, the sense amp release signal goes high releasing the sense amps.

This solution only works for memory devices that are programmable devices such as EPROMs and EEPROMs. The settings of the programmable capacitance are programmed into storage elements in the trimming step during manufacture. A major disadvantage of the trimming solution is that every product must be trimmed individually. This takes additional time and thus costs money to do.

Another disadvantage of this solution is that it will not work for ROMs because they do not contain any programmable elements after the part is packaged. Thus, for ROMs the solution is limited to applying a large enough time margin to the clock delay to prevent the occurrence of any glitches. As described above, this wastes much time and, in addition, may cause the product yield to be lower. This is due to the fact that some parts might not meet the access time specifications solely because of the large time margin that must be added to the clock delay circuit. With ROMs this is particularly troublesome because ROMs are typically custom mask programmed for a particular customer and specified to have a maximum access time. Parts that do not meet this specification cannot be sold to anyone else.

Sense amp delay circuits are known in the art. U.S. Pat. No. 4,761,765 issued to Hashimoto teaches using a reference voltage as one input to the sense amplifier. The reference voltage is generated in response to a current flowing through a dummy memory transistor.

U.S. Pat. No. 5,245,584 issued to Zampaglione et al. teaches compensating for bit line delays by controlling the sense amp of a memory array with a control signal derived in part from a dummy word line signal. The dummy word line signal being representative of the delay of a word line of the memory array.

U.S. Pat. No. 5,424,985 issued to McClure et al. teaches a delay circuit for controlling a clock sense amplifier in a static random access memory (SRAM) memory device. The delay circuit is comprised in part by elements corresponding to elements in the SRAM memory array such as memory cell transistors.

The McClure device, however, fails to emulate the entire SRAM cell, only a portion thereof. This increases the difficulty in properly viasing the emulation circuitry of the SRAM cell. Another disadvantage is that the regular SRAM cell in the main array is dependent on supply voltage in a way different then that of the delay emulation circuit.

SUMMARY OF THE INVENTION

Accordingly, it is an object of the present invention to provide a clock delay circuit that does not utilize any programmable elements and therefore eliminates the requirement of a trimming step that must be performed on each and every die during manufacture.

It is another object of the present invention to provide a clock delay circuit that can generate a delay that tracks the signal development time within the main memory array notwithstanding variations in temperatures, supply voltage and process.

Thus, there is provided in accordance with a preferred embodiment if the present invention, in a semiconductor memory circuit including a main array and sense amplifiers and utilizing a word line and a bit line, a clock delay circuit for generating a sense amplifier release signal for delaying the release of the sense amplifiers in accordance with the signal development time of the main array, the clock delay circuit receiving a trigger from an address transition detection circuit after a word line select delay, the clock delay circuit comprising a current source coupled to a supply voltage and controlled by a signal from the address transition detection circuit, the output of the current source coupled to a node, a small memory array comprising a plurality of memory cells wherein a single memory cell selected from the plurality of memory cells is set to be continuously selected, the single memory cell controlled by the word line signal, buffer means coupled between the node and the single memory cell, the single memory cell coupled between the buffer means and a ground, the buffer means operative to prevent the soft programming of the single memory cell by emulating a buffer in the main array, a bit line emulator coupled between the node and the ground, the bit line emulator emulating the capacitive load of the bit line, wherein the word line is ready at the same time the signal development within the main array begins, wherein the delay generated by the clock delay circuit is determined by a time constant defined by the parallel combination of the single memory cell and the bit line emulator, and wherein the delay generated by the clock delay circuit tracks the signal development time within the main array across variations in temperature, the supply voltage and process.

Further, the small memory array comprises a small ready only memory (ROM) array and the single memory cell comprises a single unprogrammed ROM cell. The small memory array comprises a small electrically programmable read only memory (EPROM) array and the single memory cell comprises a single unprogrammed EPROM cell. The small memory array comprises a small electrically erasable programmable ready only memory (EEPROM) array and the single memory cell comprises a single unprogrammed EEPROM cell. The small memory array comprises a small flash electrically erasable programmable read only memory (FLASH) array and the single memory cell comprises a single unprogrammed FLASH cell. The bit line emulator comprises an NMOS transistor and a bit line type of diode.

There is also provided in accordance with a preferred embodiment if the present invention, in a semiconductor memory circuit including a main array and sense amplifiers and utilizing a word line and a bit line, a clock delay circuit for generating a sense amplifier release signal for delaying the release of the sense amplifiers in accordance with the signal development time of the main array, the clock delay circuit receiving a trigger from an address transition detection circuit after a word line select delay, the clock delay circuit comprising a current source coupled to a supply voltage and controlled by a signal from the address transition detection circuit, the output of the current source coupled to a node, a small memory array comprising a plurality of memory cells wherein a single memory cell selected from the plurality of memory cells is set to be continuously selected, the single memory cell coupled between the node and a ground, the single memory cell controlled by the signal from the address transition detection circuit, a bit line emulator coupled between the node and the ground, the bit line emulator emulating the capacitive load of the bit line, wherein the word line is ready at the same time the signal development within the main array begins, wherein the delay generated by the clock delay circuit is determined by a time constant defined by the parallel combination of the single memory cell and the bit line emulator, and wherein the delay generated by the clock delay circuit tracks the signal development time within the main array across variations in temperature, the supply voltage and process.

In addition, there is provided, in accordance with a preferred embodiment of the present invention, in a semiconductor memory circuit including a main array and sense amplifiers and utilizing a word line and a bit line, a method of generating a sense amplifier release signal for delaying the release of the sense amplifiers in accordance with the signal development time of the main array, the generation of the sense amplifier release signal trigger by an address transition detection circuit after a word line select delay, the method comprising the steps of providing a current source coupled to a supply voltage and controlled by a signal from the address transition detection circuit, the output of the current source coupled to a node, providing a small memory array comprising a plurality of memory cells wherein a single memory cell selected from the plurality of memory cells is set to be continuously selected, the single memory cell controlled by the word line signal, coupling buffer means between the node and the single memory cell, the buffer means operative to prevent the soft programming of the single memory cell, coupling the single memory cell between the buffer means and a ground, emulating the load of the bit line by providing a bit line emulator coupled between the node and the ground, wherein the word line is ready at the same time the signal development within the main array begins, wherein the delay of the release of the sense amplifiers is determined by a time constant defined by the parallel combination of the single memory cell and the bit line emulator, and wherein the delay of the release of the sense amplifiers tracks the signal development time within the main array across variations in temperature, the supply voltage and process.

There is also provided in accordance with a preferred embodiment if the present invention, in a semiconductor memory circuit including a main array and sense amplifiers and utilizing a word line and a bit line, a method of generating a sense amplifier release signal for delaying the release of the sense amplifiers in accordance with the signal development time of the main array, the generation of the sense amplifier release signal triggered by an address transition detection circuit after a word line select delay, the method comprising the steps of providing a current source coupled to a supply voltage and controlled by a signal from the address transition detection circuit, the output of the current source coupled to a node, providing a small memory array comprising a plurality of memory cells wherein a single memory cell selected from the plurality of memory cells is set to be continuously selected, coupling the single memory cell between the node and a ground, the single memory cell controlled by the signal from the address transition detection circuit, emulating the load of the bit line by providing a bit line emulator coupled between the node and the ground, wherein the word line is ready at the same time the signal development within the main array begins, wherein the delay of the release of the sense amplifiers is determined by a time constant defined by the parallel combination of the single memory cell and the bit line emulator, and wherein the delay of the release of the sense amplifiers track the signal development time within the main array across variations in temperature, the supply voltage and process.

BRIEF DESCRIPTION OF THE DRAWINGS

The invention is herein described, by way of example only, with reference to the accompanying drawings, wherein.

DETAILED DESCRIPTION OF THE INVENTION

Figure 3:
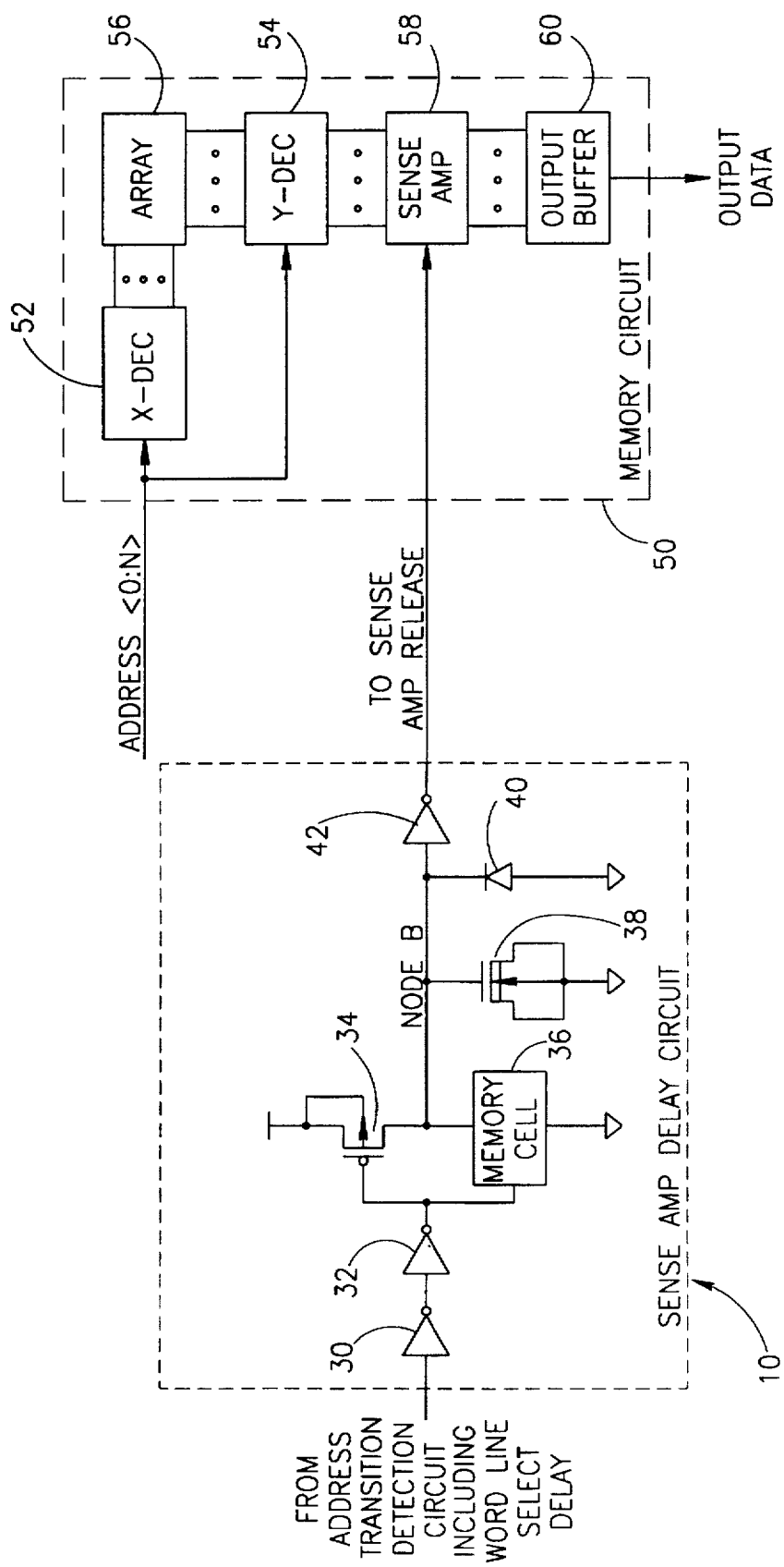
FIG. 3, is a schematic diagram illustrating a sense amplifier release delay circuit constructed in accordance with a preferred embodiment of the present invention.

A schematic diagram illustrating a sense amplifier release delay (i.e., clock delay) circuit, generally referenced 10, constructed in accordance with a preferred embodiment of the present invention is shown in FIG. 3. As discussed previously, the sense amp release delay circuit is the clock delay circuit which decides when to release the sense amps from their held position. The circuit comprises three inverters 30, 32, 42, a pull-up transistor 34, single memory cell 36, NMOS transistor 38 and a bit line type of diode 40. The output of inverter 42 is input to sense amplifier 58 of memory circuit 50. The memory circuit also comprises X-decoder 52 and Y-decoder 54 which receive address lines 0 through N. Coupled to the X and Y decoders is memory array 56 and coupled to the Y-decoder is sense amplifier 58. The output of the sense amp is coupled to output buffer 60.

The input to the sense amp delay circuit is a signal from the address transition detection circuitry including the word line select delay (not shown). This signal is input to inverter 30. The output of inverter 30 is input to inverter 32. The output of inverter 32 is input to the gate of pull-up 34 and memory cell 36. Pull-up transistor 34 may be a p-channel transistor or any other suitable pull-up device. The drain terminal of transistor 34 and one terminal from memory cell 36 are coupled to a node labeled node B in FIG. 3. NMOS transistor 38 is coupled from node B to ground and functions to emulate the fixed bit line capacitance in memory array 56. Diode 40 is also coupled between node B and ground and functions to emulate the bit line junction capacitance. Inverter 42, also coupled to node B, functions to regenerate a CMOS level and output this signal to sense amp circuitry 58 within memory circuit 50. The sense amps output a signal to output buffer 60 which generates the output data. To further reduce supply voltage dependencies, inverter 42 is preferably not symmetrical but rather asymmetrical. The p-channel pull-up portion of the inventor preferably has a stronger drive capability than the n-channel pull-down portion of approximately five times. In addition, the trip point of the p-channel pull-up is preferably a threshold voltage $V_{TP}$ below the supply voltage. The asymmetrical inverter functions as a supply voltage compensation means and reduces the sensitivity of the sense amplifier release delay circuit to variations in supply voltage.

The circuit of FIG. 3 is only appropriate for ROM memory arrays and not for other types of semiconductor memory such as EPROM, EEPROM and flash. This is due to the fact that when p-channel transistor 34 is on, a memory cell 36 other than ROM will exhibit soft programming because it is connected directly to the supply voltage.

Figure 4:
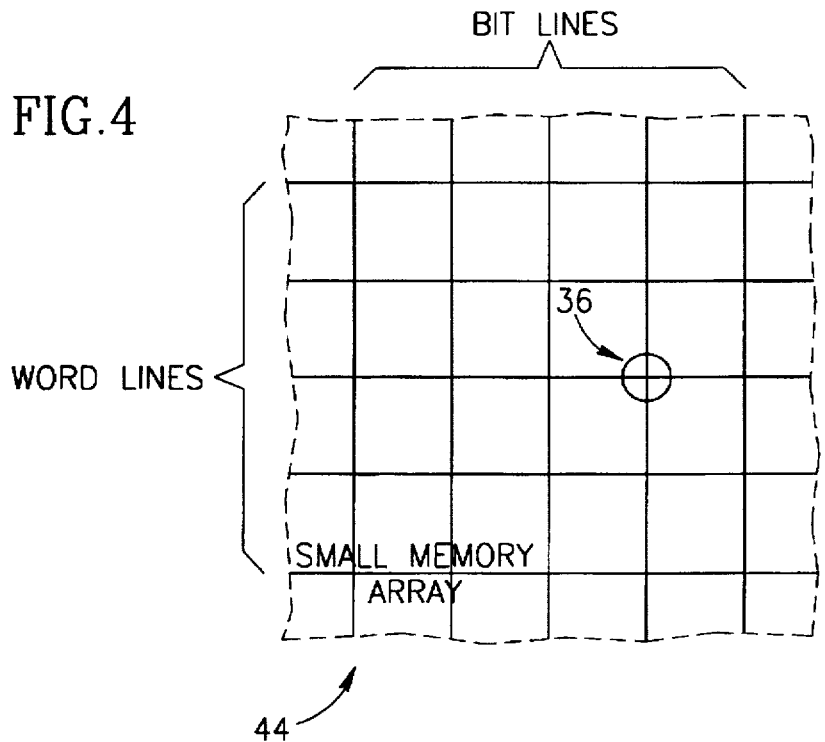
FIG. 4 illustrates the relatively small memory cell array used to emulate the delays associated with the main memory cell array.

The operation of sense amp delay circuit 10 will now be described in more detail with reference to FIGS. 3 and 4. A key concept of the present invention is that memory cell 36 is not an isolated transistor. Rather, it is a single memory cell, referenced 36 in FIG. 4, selected within a small memory array 44 of memory cells. FIG. 4 schematically illustrates the small additional memory array used in the sense amp delay circuit. The memory array may be on the order of 5 by 5 or 10 by 10 memory cells (i.e., 5 to 10 bit lines and 5 to 10 word lines). The memory array 44 of 5 by 5 or 10 by 10 memory cells is in relation to the main array 56 (FIG. 3) which may comprise 1000 by 1000 memory cells making up a 1 Mb array. A single non-programmed transistor is configured to be always constantly selected, the remainder of the cells being grounded. When an address transition is detected and after the word line select delay the input to inverter 30 goes low causing the output of inverter 32 to go low. This causes the pull-up transistor 34 to turn on and memory cell 36 to turn off. Transistor 34 is used to pull node B up. When the word line is ready, the array precharge ceases, the signal development in the memory array 56 begins and the input of inverter 30 goes high causing the output of inverter 32 to go high. This causes the pull-up transistor 34 to turn off and memory cell 36 to turn on. Memory cell 36 is used to pull node B down. When node B is low enough, inverter 42 toggles and the sense amp is released. The memory array 44 is part of the same integrated circuit and uses the same processing as the main memory array, thus it's characteristics match those of the main memory array 56. Thus, variations in read current in main array 56 are matched in smaller memory array 44. The bit line capacitance (i.e., the bit line load) normally present in the main array 56 is emulated by the capacitance provided by transistor 38 and a bit line type of diode 40. A capacitance is utilized to emulate the bit line load or capacitance because the bit line in the main array is typically very long and would require an unreasonable amount of chip die size to duplicate for the small memory array. Typically, the capacitance of the bit line emulator is smaller than the actual bit line capacitance of the main array 56. Thus, the signal development within the main array 56 is matched to or tacks the delay within the clock delay circuit regardless of variations in temperature, supply voltage or process characteristics of the chip.

Figure 5:
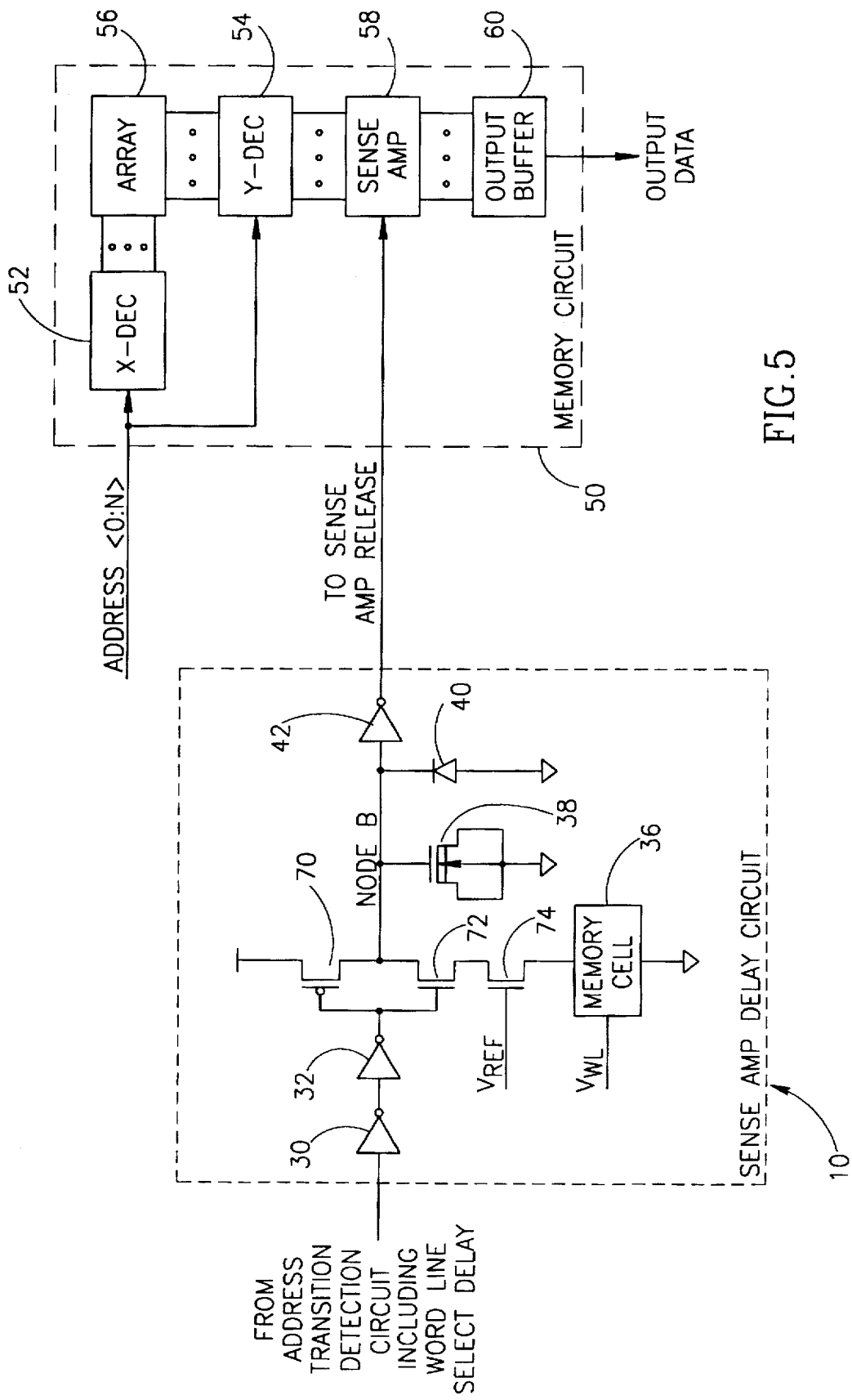
FIG. 5, is a schematic diagram illustrating an alternative sense amplifier release delay circuit constructed in accordance with a preferred embodiment of the present invention.

A schematic diagram illustrating an alternative sense amplifier release delay circuit constructed in accordance with a preferred embodiment of the present invention is shown in FIG. 5. The circuit illustrated in FIG. 5 is similar in operation to the that of FIG. 3 with additional components added for adapting the present invention to include other types of semiconductor memory such as EPROM, EEPROM and flash in addition to ROM. In order to prevent soft programming of the memory cell 36, n-channel transistors 72 and 74 are added in totem pole fashion to memory cell 36 and function as a buffer. This buffer functions to emulate the buffer used in the main array. The memory cell 36 shown in FIG. 5 is contemplated to be any type of semiconductor memory device such as ROM, EPROM, EEPROM or flash. Thus, the circuit of FIG. 5 is the more general case of the circuit of FIG. 3.

Node B is now driven low by memory cell 36 and n-channel transistor 74. Transistor 74 prevents soft programming of the memory cell 36 by preventing the memory cell from being connected to the supply voltage. The memory cell 36 is driven by the word line voltage $V_{WL}$. The word line voltage $V_{WL}$ can be supplied by various sources such as the supply voltage, from a charge pump circuit or from a clamping circuit, for example. The benefit of a charge pump circuit is that the word line voltage can go higher than the supply voltage. A clamping circuit generates a word line signal that tracks the supply voltage up to a predetermined level and then clamps thereafter. Transistor 74 is driven by a reference voltage $V_{REF}$ and acts as a buffer transistor buffering the memory cell from being directly connected to the supply voltage. It is intended that this buffer means emulate the buffer in the main array. The reference voltage is chosen so as to limit the voltage across the memory cell to approximately the same level as the bit line voltage.

It is important to note that the word line voltage $V_{WL}$ and the reference voltage $V_{REF}$ are generated elsewhere in the memory circuit and in a preferred embodiment are used within the sense amplifier release delay circuit in order to better emulate the delays within the memory array.

Figure 1:
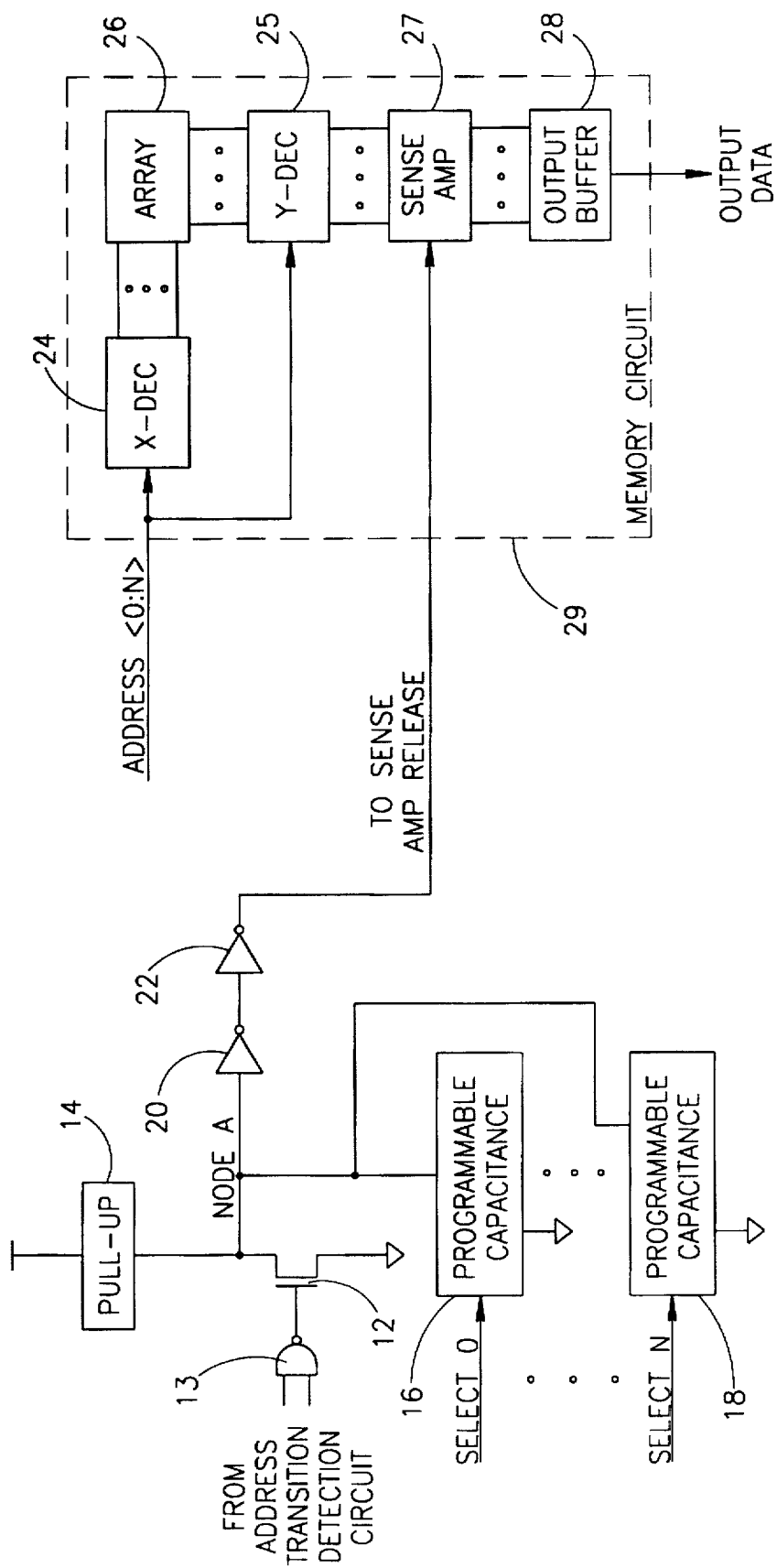
FIG. 1 is a schematic diagram illustrating the prior art programmable clock delay circuit used to vary the delay given to the word line signal which releases the sense amplifiers.
Figure 2:
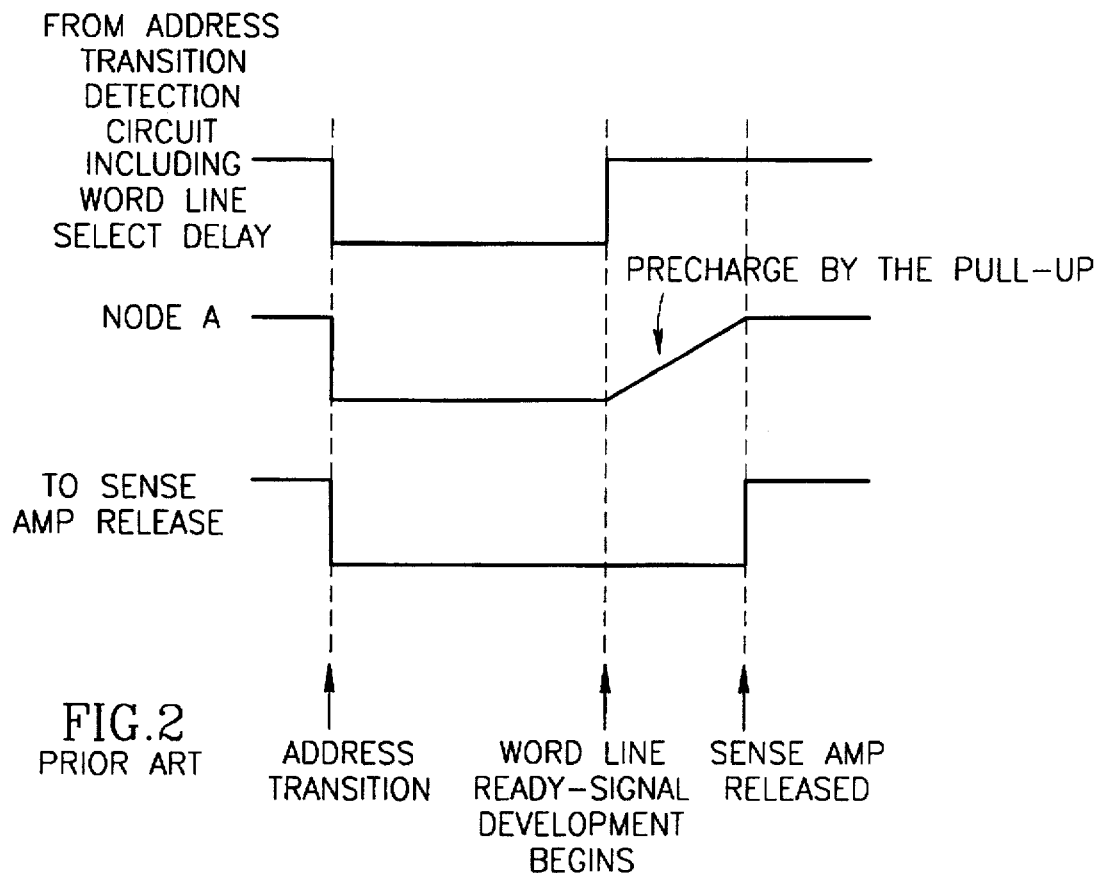
FIG. 2 is a timing diagram illustrating the timing relationship between the various signal shown in FIG. 1.
Figure 6:
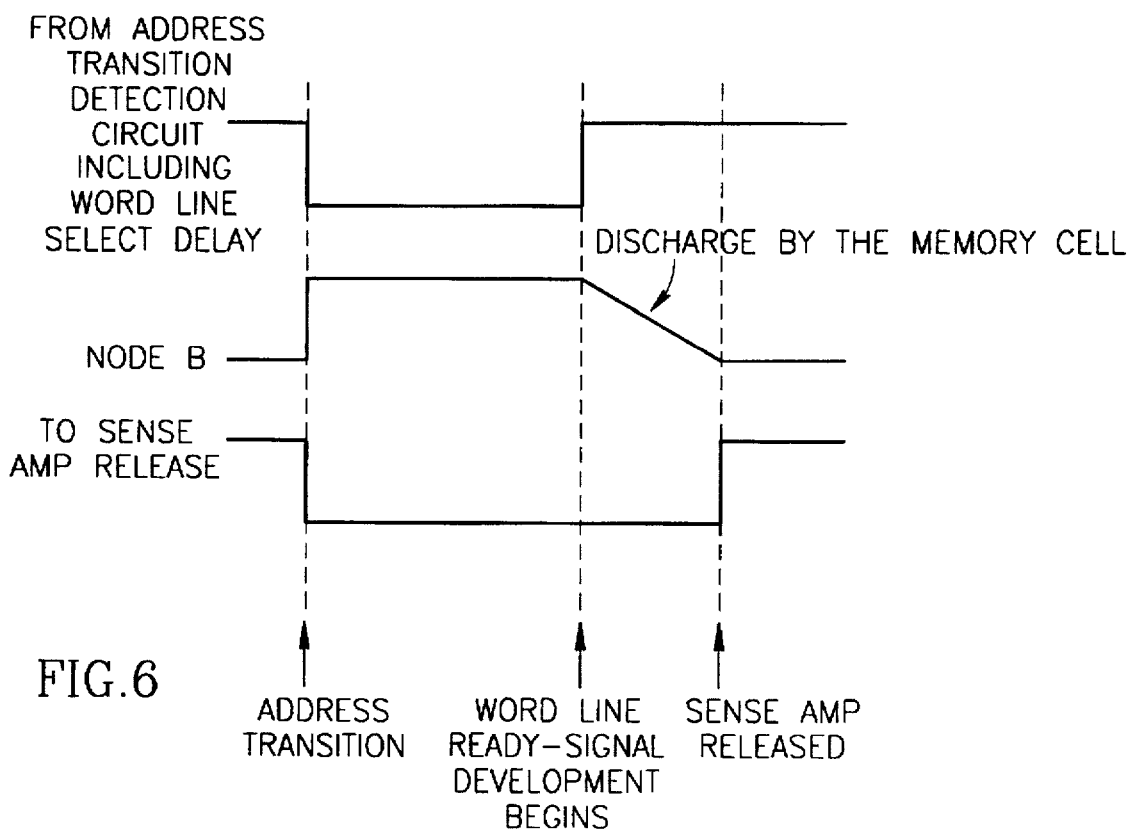
FIG. 6 is a timing diagram illustrating the timing relationship between the various signal shown in FIG. 3.

The timing relationships of the circuits illustrated in FIGS. 3 and 5 are shown in FIG. 6. The address transition detection signal falls low when a transition is detected. After the word line select delay, the main memory array and the sense amp delay circuit are precharged. Once the word line is ready, the sense amp delay signal goes low and node B is quickly charged. Once the address transition detection signal including the word line select delay goes high, node B begins discharging in accordance with the time constant of the parallel combination of the memory cell and bit line emulator. At this point the word line is ready, array equalization ends and signal development in the main array begins. Once a threshold is reached, the sense amp release signal goes high releasing the sense amps. It is important to note that the signal development within the main array 56 and the discharge of the single memory cell 36 (FIG. 3) both begin at the same time.

The programmable capacitances of the prior art are replaced by a memory cell within a small array and a bit line emulator (i.e., bit line capacitance). The delay time constant comprising memory cell 36 and the bit line emulator (i.e., transistor 38 and diode 40) can be tuned to generate a signal that is matched to the signal development time in the main array 56 plus an arbitrary predetermined margin or delta. The margin or delta can be chosen (e.g., 10 or 20%) so that the signal generated by the sense amp delay circuitry tracks the main array signal over the desired characteristics such as temperature, supply voltage, process etc. The sense amp delay circuit is able to track the variations in the main array 56 because the clock delay is generated with an actual memory cell along with the simulated bit line capacitance.

In main memory array 56, the sense amps are typically designed to sense approximately 50 mV. In the sense amp delay circuit, rather than sense 50 mV, a voltage of approximately 1 to 2 V (CMOS level) is sensed instead. This results in a bit line capacitance ratio of approximately 20 or 40:1 between the actual bit line in the main array 56 and the simulated bit line capacitance provided by transistor 38 and diode 40. Thus, the voltage swing which occurs on node B, caused by the memory cell discharging the simulated bit line capacitance, is much larger than the voltage swing which occurs in the main array 56. This simplified the sense amplifier delay circuit since complex sense amp circuitry is not required.

Using the sense amp delay circuit of FIGS. 3 and 5, it is possible to accurately match the signal development time of the main array 56 to the clock delay of the sense amp delay circuit. If it takes double the time to develop the signal in the main array 56, the clock delay generated by the sense amp delay circuit will increase accordingly. Thus, any percentage of time margin added to the clock delay will remain relatively constant no matter the variations in the signal development within the main array 56.

Figure 7:
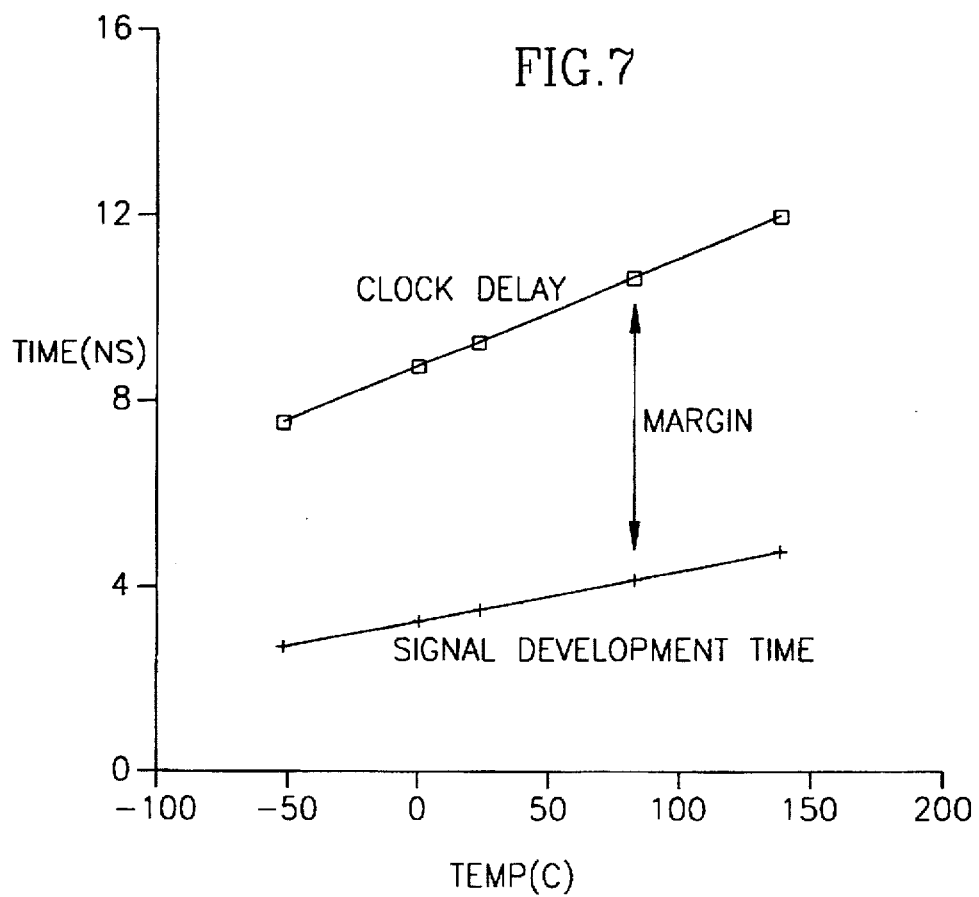
FIG. 7 is a graph illustrating the signal development time and clock delay time versus temperature for the sense amp delay circuit constructed in accordance with a preferred embodiment of the present invention.
Figure 8:
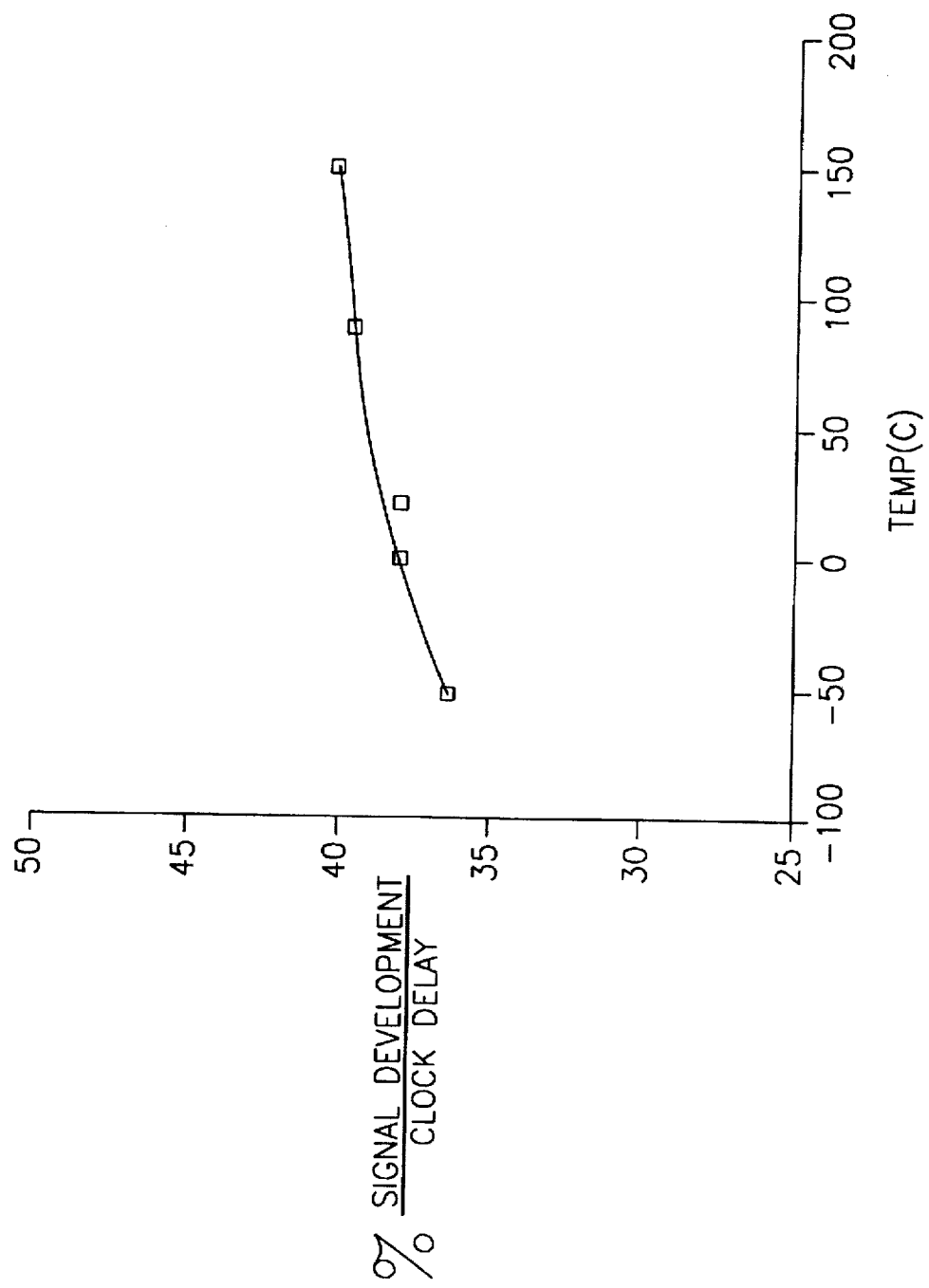
FIG. 8 is a graph of the percentage clock delay time over signal development time versus temperature for the figures presented in the graph shown in FIG. 6.

A graph illustrating the signal development time and clock delay time versus temperature for a sense amp delay circuit constructed in accordance with a preferred embodiment of the present invention is shown in FIG. 7. The circuit was constructed to generate a signal of approximately 300 mV. In addition, at room temperature, the safety margin for the sense amp delay circuit was set to 38%. The signal development time is shown in the lower graph as a function of temperature from −55 to 150 degrees Celsius. The upper graph shows the clock delay generated by the sense amp delay circuit also as a function of the same temperature range. The difference between the two graphs is the margin. A graph of signal development time over the generated clock delay expressed as a percentage is illustrated in FIG. 8. The percent delta or margin over the entire range of −55 to 150 degrees Celsius ranges from approximately 36% to 40%. Thus, the mismatch is only +/−2% which can be considered almost negligible.

It is important to note that if the circuit was constructed to generate a signal on the same order of magnitude of the signal generated in the main array (i.e., 50 mV) than it would be required to put a sense amp in the circuit in order to detect such a low level signal. Thus, a larger signal is generated in order to be able to drive an inverter stage (e.g., inverter 42 in FIG. 3) without the necessity for a sense amplifier. The memory cell in the small array (FIG. 4) is used to accomplish this in combination with a smaller bit line capacitance in order to drive a much larger signal. With the sense amp delay circuit of the present invention a large signal swing on the smaller bit line capacitance (i.e., transistor 38 and diode 40 in FIG. 3) can emulate the small signal swing over the larger capacitance of the bit line within the main array 56 (FIG. 3). This reduces the additional time that must be added to the clock delay in order that the margin or delta satisfy the entire range of temperature and supply voltage. In other words, an array bit line emulator has been inserted into the CMOS logic of the clock delay which functions to emulate the delays of the main array 56 without the need for a full blown array requiring sense amps, etc. Very accurate matching of the main array to the CMOS sense amp delay circuit is achieved due to the use of a small array to emulate the larger main array.

While the invention has been described with respect to a limited number of embodiments, it will be appreciated that many variations, modifications and other applications of the invention may be made.

What is claimed is:

1. In a semiconductor memory circuit including a main array and sense amplifiers and utilizing a word line and a bit line, a clock delay circuit for generating a sense amplifier release signal for delaying the release of said sense amplifiers in accordance with the signal development time of said main array, said clock delay circuit receiving a trigger from an address transition detection circuit after a word line select delay, said clock delay circuit comprising:

a current source coupled to a supply voltage and controlled by a signal from said address transition detection circuit, the output of said current source coupled to a node;

a small memory array comprising a plurality of memory cells wherein a single memory cell selected from said plurality of memory cells is set to be continuously selected, said single memory cell controlled by said word line signal;

buffer means coupled between said node and said single memory cell, said single memory cell coupled between said buffer means and a ground, said buffer means operative to prevent the soft programming of said single memory cell and to emulate a buffer in said main array;

a bit line emulator coupled between said node and said ground, said bit line emulator emulating the capacitive load of said bit line;

wherein said word line is ready at the same time said signal development within said main array begins;

wherein the delay generated by said clock delay circuit is determined by a time constant defined by the parallel combination of said single memory cell and said bit line emulator; and wherein said delay generated by said clock delay circuit racks said signal development time within said main array across variations in temperature, said supply voltage and process.

2. The clock delay circuit according to claim 1, wherein said small memory array comprises a small read only memory (ROM) array and said single memory cell comprises a single unprogrammed ROM cell.

3. The clock delay circuit according to claim 1, wherein said small memory array comprises a small electrically programmable read only memory (EPROM) array and said single memory cell comprises a single unprogrammed EPROM cell.

4. The clock delay circuit according to claim 1, wherein said small memory array comprises a small electrically erasable programmable read only memory (EEPROM) array and said single memory cell comprises a single unprogrammed EEPROM cell.

5. The clock delay circuit according to claim 1, wherein said small memory array comprises a small flash electrically erasable programmable read only memory (FLASH) array and said single memory cell comprises a single unprogrammed FLASH cell.

6. The clock delay circuit according to claim 1, wherein said bit line emulator comprises an NMOS transistor and a bit line type of diode.

7. In a semiconductor memory circuit including a main array and sense amplifiers and utilizing a word line and a bit line, a clock delay circuit for generating a sense amplifier release signal for delaying the release of said sense amplifiers in accordance with the signal development time of said main array, said clock delay circuit receiving a trigger from an address transition detection circuit after a word line select delay, said clock delay circuit comprising:

a current source coupled to a supply voltage and controlled by a signal from said address transition detection circuit, the output of said current source coupled to a node;

a small memory array comprising a plurality of memory cells wherein a single memory cell selected from said plurality of memory cells is set to be continuously selected, said single memory cell coupled between said node and a ground, said single memory cell controlled by said signal from said address transition detection circuit;

a bit line emulator coupled between said node and said ground, said bit line emulator emulating the capacitive load of said bit line;

wherein said word line is ready at the same time said signal development within said main array begins;

wherein the delay generated by said clock delay circuit is determined by a time constant defined by the parallel combination of said single memory cell and said bit line emulator; and wherein said delay generated by said clock delay circuit tracks said signal development time within said main array across variations in temperature, said supply voltage and process.

8. The clock delay circuit according to claim 7, wherein said small memory array comprises a small read only memory (ROM) array and said single memory cell comprises a single unprogrammed ROM cell.

9. The clock delay circuit according to claim 7, wherein said bit line emulator comprises an NMOS transistor and a bit line type of diode.

10. In a semiconductor memory circuit including a main array and sense amplifiers and utilizing a word line and a bit line, a method of generating a sense amplifier release signal for delaying the release of said sense amplifiers in accordance with the signal development time of said main array, said generation of said sense amplifier release signal triggered by an address transition detection circuit after a word line select delay, said method comprising the steps of:

providing a current source coupled to a supply voltage and controlled by a signal from said address transition detection circuit, the output of said current source coupled to a node;

providing a small memory array comprising a plurality of memory cells wherein a single memory cell selected from said plurality of memory cells is set to be continuously selected, said single memory cell controlled by said word line signal;

coupling buffer means between said node and said single memory cell, said buffer means operative to prevent the soft programming of said single memory cell and to emulate a buffer in said main array;

coupling said single memory cell between said buffer means and a ground;

emulating the load of said bit line by providing a bit line emulator coupled between said node and said ground;

wherein said word line is ready at the same time said signal development within said main array begins;

wherein the delay of the release of said sense amplifiers is determined by a time constant defined by the parallel combination of said single memory cell and said bit line emulator; and wherein the delay of the release of said sense amplifiers tracks said signal development time within said main array across variations in temperature, said supply voltage and process.

11. The method according to claim 10, wherein said small memory array comprises a small electrically programmable read only memory (EPROM) array and said single memory cell comprises a single unprogrammed EPROM cell.

12. The clock delay circuit according to claim 10, wherein said small memory array comprises a small electrically erasable programmable read only memory (EEPROM) array and said single memory cell comprises a single unprogrammed EEPROM cell.

13. The method according to claim 10, wherein said small memory array comprises a small read only memory (ROM) array and said single memory cell comprises a single unprogrammed ROM cell.

14. The method according to claim 10, wherein said small memory array comprises a small flash electrically erasable programmable read only memory (FLASH) array and said single memory cell comprises a single unprogrammed FLASH cell.

15. The clock delay circuit according to claim 10, wherein said bit line emulator comprises an NMOS transistor and a bit line type of diode.

16. In a semiconductor memory circuit including a main array and sense amplifiers and utilizing a word line and a bit line, a method of generating a sense amplifier release signal for delaying the release of said sense amplifiers in accordance with the signal development time of said main array, said generation of said sense amplifier release signal triggered by an address transition detection circuit after a word line select delay, said method comprising the steps of:

providing a current source coupled to a supply voltage and controlled by a signal from said address transition detection circuit, the output of said current source coupled to a node;

providing a small memory array comprising a plurality of memory cells wherein a single memory cell selected from said plurality of memory cells is set to be continuously selected;

coupling said single memory cell between said node and a ground, said single memory cell controlled by said signal from said address transition detection circuit;

emulating the load of said bit line by providing a bit line emulator coupled between said node and said ground;

wherein said word line is ready at the same time said signal development within said main array begins;

wherein the delay of the release of said sense amplifiers is determined by a time constant defined by the parallel combination of said single memory cell and said bit line emulator; and wherein the delay of the release of said sense amplifiers tracks said signal development time within said main array across variations in temperature, said supply voltage and process.

17. The clock delay circuit according to claim 16, wherein said small memory array comprises a small read only memory (ROM) array and said single memory cell comprises a single unprogrammed ROM cell.

18. The clock delay circuit according to claim 16, wherein said bit line emulator comprises an NMOS transistor and a bit line type of diode.

19. In a semiconductor memory circuit including a main array and sense amplifiers and utilizing a word line and a bit line, a clock delay circuit for generating a sense amplifier release signal for delaying the release of said sense amplifiers in accordance with the signal development time of said main array, said clock delay circuit receiving a trigger from an address transition detection circuit after a word line select delay, said clock delay circuit comprising:

- a current source coupled to a supply voltage and controlled by a signal from said address transition detection circuit, the output of said current source coupled to a node;
- a small memory array comprising a plurality of memory cells wherein a single memory cell selected from said plurality of memory cells is set to be continuously selected, said single memory cell controlled by said word line signal;
- buffer means coupled between said node and said single memory cell, said single memory cell coupled between said buffer means and a ground, said buffer means operative to prevent the soft programming of said single memory cell and to emulate a buffer in said main array;
- a bit line emulator coupled between said node and said ground, said bit line emulator emulating the capacitive load of said bit line;
- supply voltage compensation means coupled to said node, said supply voltage compensation means generating said sense amplifier release signal from said node voltage, said supply voltage compensation means reducing the sensitivity of said clock delay circuit to variations in said supply voltage;
- wherein said word line is ready at the same time said signal development within said main array begins;
- wherein the delay generated by said clock delay circuit is determined by a time constant defined by the parallel combination of said single memory cell and said bit line emulator; and
- wherein said delay generated by said clock delay circuit tracks said signal development time within said main array across variations in temperature, said supply voltage and process.

20. The clock delay circuit according to claim 19, wherein said small memory array comprises a small read only memory (ROM) array and said single memory cell comprises a single unprogrammed ROM cell.

21. The clock delay circuit according to claim 19, wherein said small memory array comprises a small electrically programmable read only memory (EPROM) array and said single memory cell comprises a single unprogrammed EPROM cell.

22. The clock delay circuit according to claim 19, wherein said small memory array comprises a small electrically erasable programmable read only memory (EEPROM) array and said single memory cell comprises a single unprogrammed EEPROM cell.

23. The clock delay circuit according to claim 19, wherein said small memory array comprises a small flash electrically erasable programmable read only memory (FLASH) array and said single memory cell comprises a single unprogrammed FLASH cell.

24. The clock delay circuit according to claim 19, wherein said bit line emulator comprises an NMOS transistor and a bit line type of diode.

25. The clock delay circuit according to claim 19, wherein said supply voltage compensation means comprises an asymmetrical inverter wherein a low to high output transition is triggered approximately a threshold voltage $V_{TP}$ below said supply voltage.

* * * * *